(12) United States Patent
Shu et al.

(10) Patent No.: US 10,586,860 B2
(45) Date of Patent: Mar. 10, 2020

(54) METHOD OF MANUFACTURING FINFET DEVICES USING NARROW AND WIDE GATE CUT OPENINGS IN CONJUNCTION WITH A REPLACEMENT METAL GATE PROCESS

(71) Applicant: GLOBALFOUNDRIES INC., Grand Cayman (KY)

(72) Inventors: Jiehui Shu, Clifton Park, NY (US); Laertis Economikos, Wappingers Falls, NY (US); Xusheng Wu, Ballston Lake, NY (US); John Zhang, Altamont, NY (US); Haigou Huang, Rexford, NY (US); Hui Zhan, Clifton Park, NY (US); Tao Han, Clifton Park, NY (US); Haiting Wang, Clifton Park, NY (US); Jinping Liu, Ballston Lake, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/970,217

(22) Filed: May 3, 2018

(65) Prior Publication Data

US 2019/0341475 A1 Nov. 7, 2019

(51) Int. Cl.
| | |
|---|---|
| *H01L 29/66* | (2006.01) |
| *H01L 21/02* | (2006.01) |
| *H01L 21/306* | (2006.01) |
| *H01L 21/308* | (2006.01) |
| *H01L 21/8238* | (2006.01) |
| *H01L 21/3065* | (2006.01) |

(52) U.S. Cl.
CPC .. *H01L 29/66818* (2013.01); *H01L 21/02532* (2013.01); *H01L 21/02636* (2013.01); *H01L 21/3065* (2013.01); *H01L 21/3081* (2013.01); *H01L 21/30625* (2013.01); *H01L 21/823807* (2013.01); *H01L 21/823821* (2013.01); *H01L 29/6656* (2013.01)

(58) Field of Classification Search
CPC ..... H01L 21/823437; H01L 21/823828; H01L 29/66621; H01L 29/66545; H01L 29/66553; H01L 29/6656; H01L 29/4236
See application file for complete search history.

(56) References Cited

U.S. PATENT DOCUMENTS

| | | | | |
|---|---|---|---|---|
| 9,412,616 B1* | 8/2016 | Xie | ........... | H01L 21/76224 |
| 9,812,365 B1* | 11/2017 | Zhang | ........... | H01L 29/66545 |
| 2017/0018628 A1* | 1/2017 | Greene | ........... | H01L 29/66545 |

* cited by examiner

*Primary Examiner* — Ermias T Woldegeorgis
(74) *Attorney, Agent, or Firm* — Francois Pagette; Hoffman Warnick LLC

(57) ABSTRACT

In conjunction with a replacement metal gate (RMG) process for forming a fin field effect transistor (FinFET), gate isolation methods and associated structures leverage the formation of distinct narrow and wide gate cut regions in a sacrificial gate. The formation of a narrow gate cut between closely-spaced fins can decrease the extent of etch damage to interlayer dielectric layers located adjacent to the narrow gate cut by delaying the deposition of such dielectric layers until after formation of the narrow gate cut opening. The methods and resulting structures also decrease the propensity for short circuits between later-formed, adjacent gates.

10 Claims, 9 Drawing Sheets

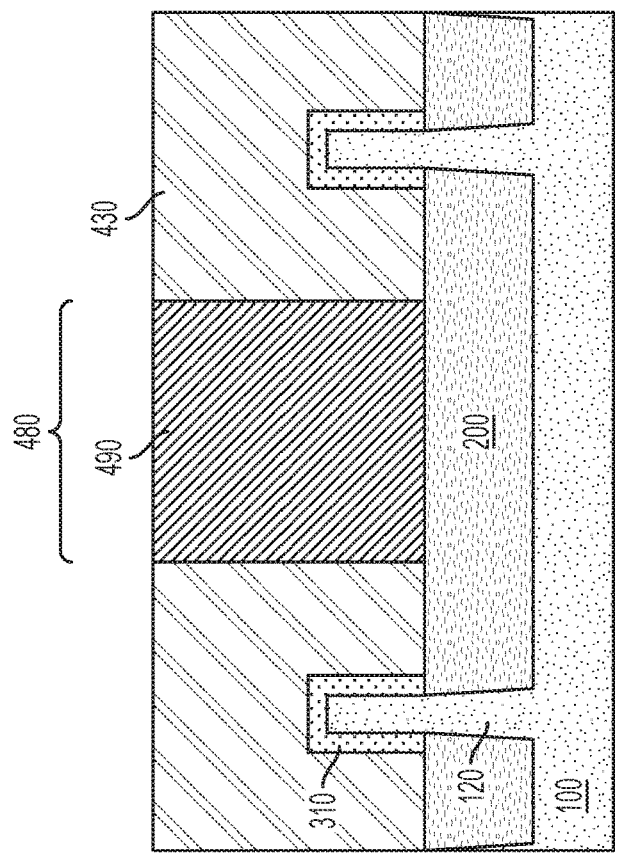
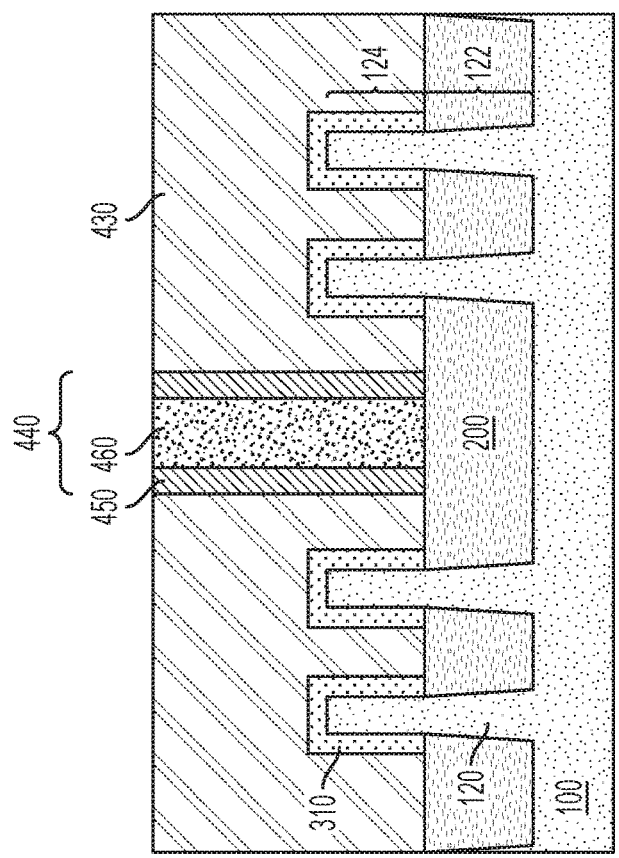
FIG. 1A
FIG. 1B

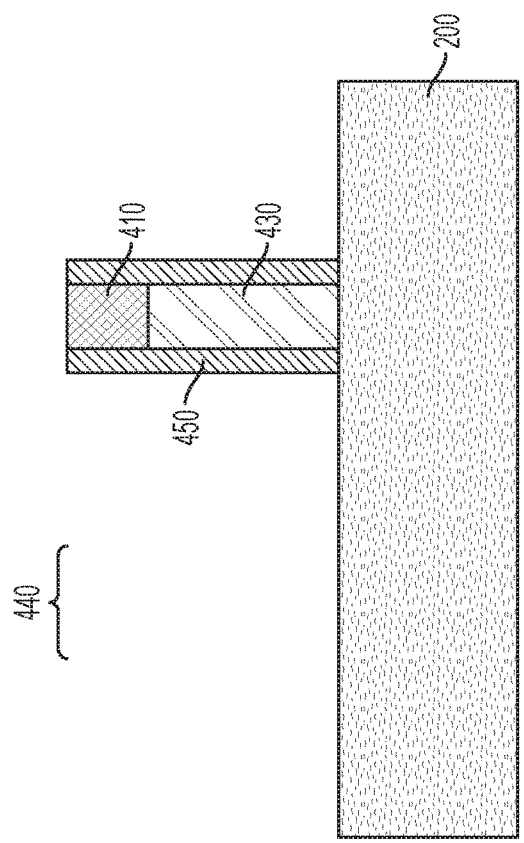
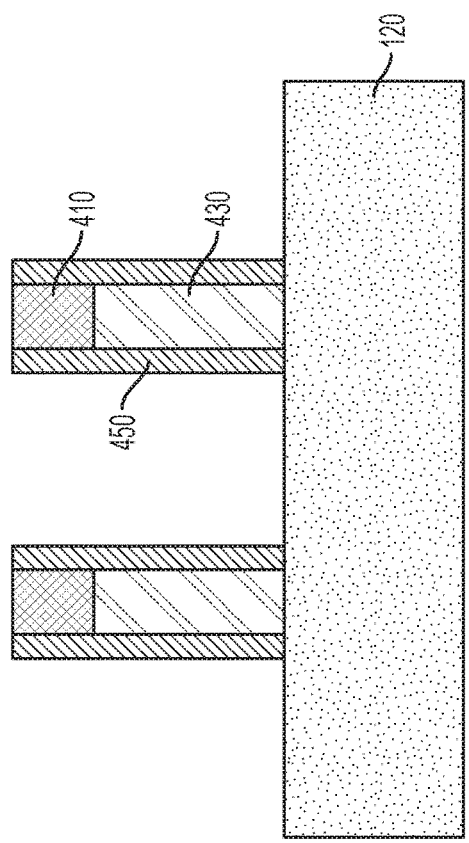
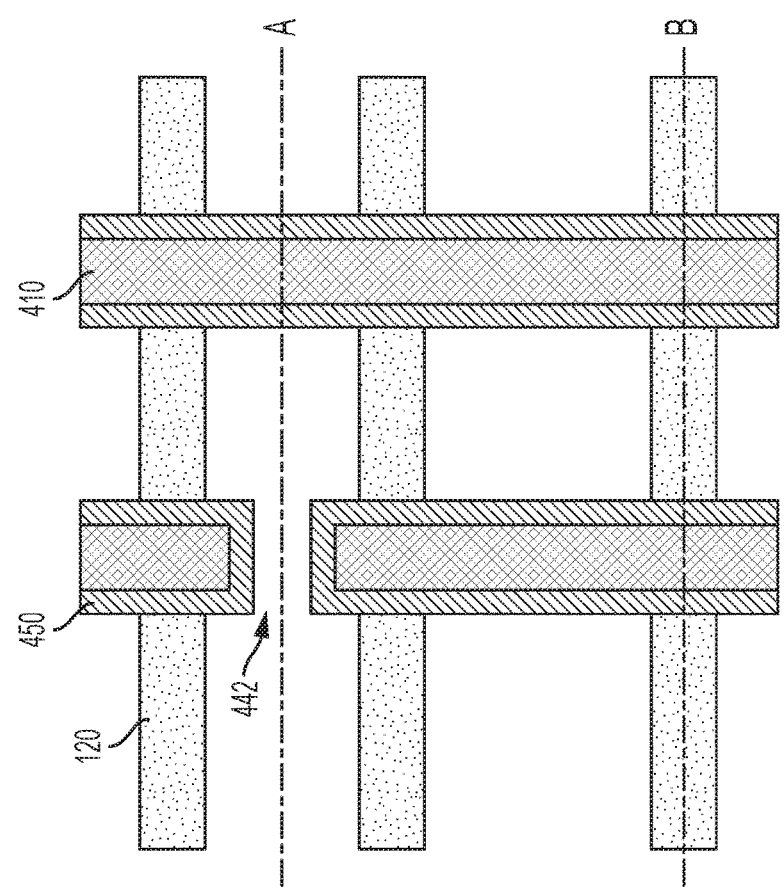
FIG. 5A
FIG. 5B
FIG. 5

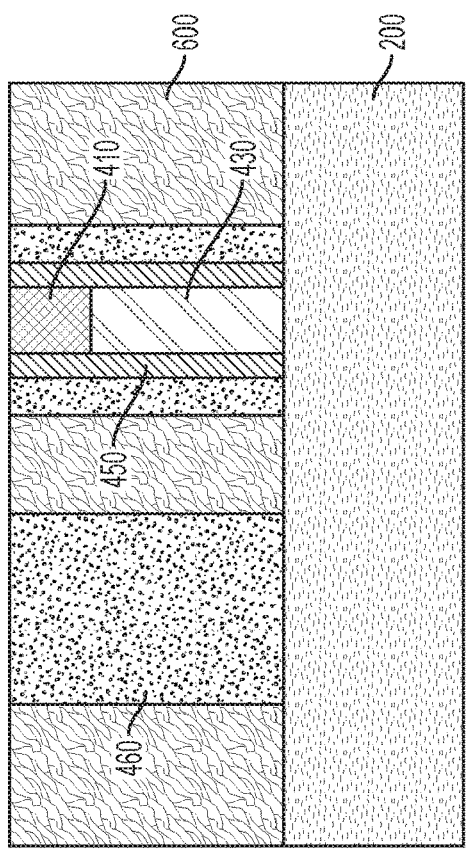
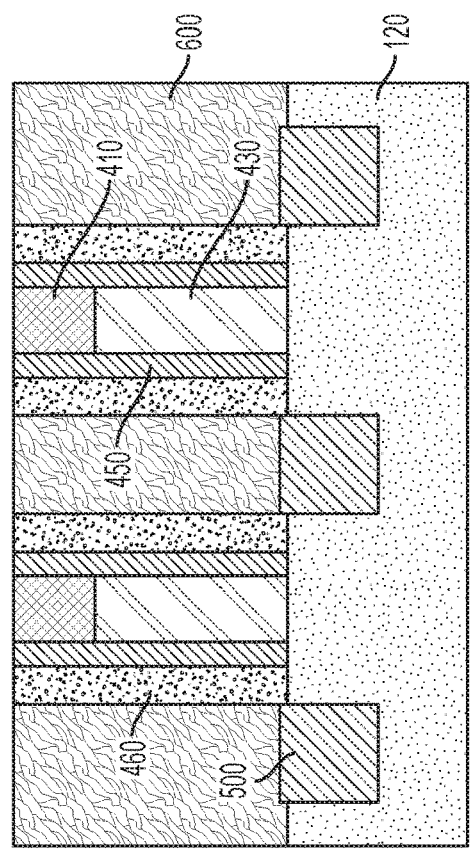
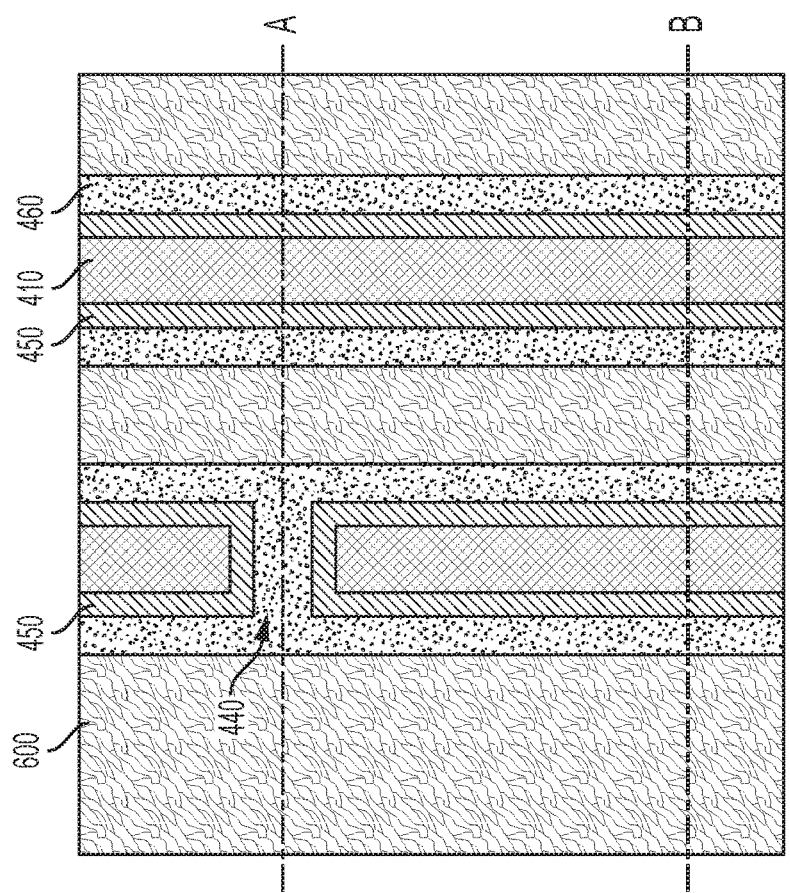

METHOD OF MANUFACTURING FINFET DEVICES USING NARROW AND WIDE GATE CUT OPENINGS IN CONJUNCTION WITH A REPLACEMENT METAL GATE PROCESS

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is typically replaced by a functional gate after device activation, i.e., after dopant implantation into source/drain regions of the fins and an associated drive-in anneal, in order to avoid exposing the functional gate materials to the thermal budget associated with activation.

Prior to removing the sacrificial gate and forming a functional gate, a gate cut module may be used to sever (i.e., segment) the sacrificial gate in order to define and isolate plural adjacent devices. In association with such a process, portions of the sacrificial gate are removed to form openings that are back-filled with an etch selective dielectric material, i.e., isolation layer, that provides a barrier between adjacent functional gates following removal and replacement of the remaining sacrificial gate material. At advanced nodes, however, notwithstanding recent developments, it remains a challenge to define a gate cut opening with both the desired critical dimension(s) and alignment precision amidst a plurality of densely-arrayed fins.

SUMMARY

Accordingly, it would be beneficial to provide a method for defining a sacrificial gate at critical dimensions with a high degree of accuracy and precision, especially a sacrificial gate that enables formation of a functional gate at advanced nodes while avoiding short circuits between adjacent gates, altering design rules or otherwise compromising real estate.

As used herein, a "functional gate" or "gate" refers to a structure used to control output current (i.e., the flow of carriers through a channel) of a semiconductor device using an electrical field or, in some instances, a magnetic field, and includes a gate dielectric and a gate conductor.

Disclosed is a hybrid gate cut scheme that may be used in conjunction with a replacement metal gate (RMG) process flow for manufacturing fin field effect transistors (FinFETs) where separate patterning, etching, and deposition steps are used to define and back-fill gate cut openings to form respective narrow and wide gate cut openings, such as between closely-spaced fins and remotely-spaced fins.

In example embodiments, narrow gate cut openings are formed using a cut first methodology, where the narrow gate cut openings are formed after deposition of a sacrificial gate layer, but before (or during) patterning and etching of the sacrificial gate layer to form sacrificial gate. The narrow gate cut openings are back-filled with a composite dielectric layer, i.e., first and second spacer layers. Wide gate cut openings, on the other hand, are formed using a cut last methodology, where wide gate cut openings are formed after deposition and patterning of the sacrificial gate layer to form the sacrificial gates. A single dielectric layer is deposited to back-fill the wide gate cut openings.

According to certain embodiments, a method of forming a semiconductor structure includes forming a plurality of semiconductor fins over a semiconductor substrate, forming a sacrificial gate layer over the fins, and etching the sacrificial gate layer to form a sacrificial gate and a narrow gate cut opening extending through a portion of the sacrificial gate between adjacent fins.

A first spacer layer is formed over sidewalls of the sacrificial gate, and a second spacer layer is formed over sidewalls of the first spacer layer. The sacrificial gate is thereafter etched to form a wide gate opening extending through the sacrificial gate between adjacent fins, and a dielectric fill layer is deposited within the wide gate cut opening According to further embodiments, a semiconductor structure includes a plurality of semiconductor fins disposed over a semiconductor substrate, and a functional gate disposed over a channel region of each of the fins. A narrow gate cut region extends between a first functional gate and a second functional gate, where the narrow gate cut region includes a first spacer layer and a second spacer layer. The first spacer layer is disposed over a sidewall of the first functional gate and over a sidewall of the second functional gate, and the second spacer layer is disposed over sidewalls of the first spacer layer.

The structure further includes a wide gate cut region extending between a third functional gate and a fourth functional gate, where the wide gate cut region comprises a dielectric fill layer.

The disclosed methods can inhibit gouging of an inter-layer dielectric (ILD) disposed proximate to the narrow gate cut openings, because the narrow gate cut openings are defined prior to deposition of the ILD. Furthermore, the disclosed methods and resulting structures decrease the propensity for short circuits between adjacent functional gates.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 1A is a simplified cross-sectional view of a FinFET architecture according to various embodiments showing a narrow gate cut region between adjacent fins;

FIG. 1B is a simplified cross-sectional view of a FinFET architecture according to various embodiments showing a wide gate cut region;

FIG. 5 shows the structure of FIG. 4 after the formation of a first spacer layer over sidewalls of the sacrificial gates and within the narrow gate cut opening;

FIG. 5A depicts a sacrificial gate and the first spacer layer disposed over sidewalls of the sacrificial gate;

FIG. 5B shows the first spacer layer disposed over sidewalls of the pair of sacrificial gates;

FIG. 7 depicts the formation of an interlayer dielectric over contact and non-contact regions between the sacrificial gates;

FIG. 7A depicts the formation of the interlayer dielectric between a sacrificial gate and the narrow gate cut region;

FIG. 7B depicts the formation of the interlayer dielectric between the pair of sacrificial gates and over the source/drain junctions;

DETAILED DESCRIPTION

Figure 3:
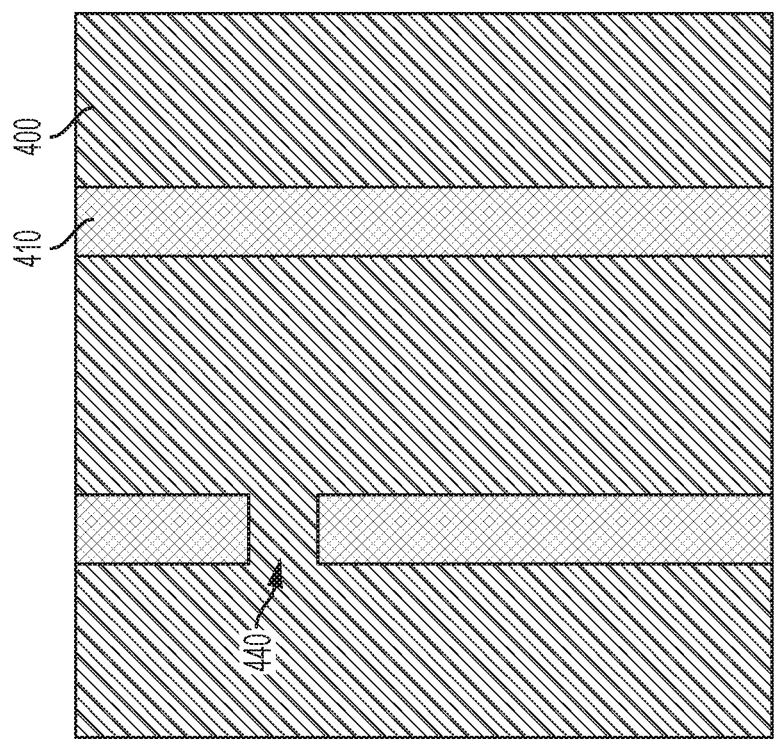
FIG. 3 shows the result of further etching of the hard mask to define a narrow gate cut region.

Reference will now be made in greater detail to various embodiments of the subject matter of the present application, some embodiments of which are illustrated in the accompanying drawings. The same reference numerals will be used throughout the drawings to refer to the same or similar parts.

Disclosed are FinFET device structures and methods of manufacturing FinFET devices, and more particularly methods where the separation of adjacent devices includes the formation of both a narrow gate cut region such as between closely-spaced fins, and a wide gate cut region such as between remotely-spaced fins. A narrow gate cut opening, which is filled with first and second spacer layers to define the narrow gate cut region, is formed during etching of a sacrificial gate layer to form sacrificial gates, while a wide gate cut opening, which is filled with a single dielectric layer to define the wide gate cut region, is formed after formation of the sacrificial gates.

In FIG. 1A and FIG. 1B, plural semiconductor fins 120 are arrayed over a semiconductor substrate 100 and a sacrificial gate 430 is arranged orthogonal to and straddles the fins 120. In FIG. 1A, as will be explained in further detail herein, a narrow gate cut region 440 between fins 120 partitions sacrificial gates 430 and includes first and second spacer layers 450, 460 within the narrow gate cut region 440. In FIG. 1B, a wide gate cut region 480 includes a dielectric layer 490 between sacrificial gates 430 that overlie neighboring fins 120.

It will be understood that the narrow gate cut region 440 and the wide gate cut region 480 may be formed within different device regions over the same substrate 100. Methods of forming such a hybrid gate cut architecture, including both narrow and wide gate cut regions, are described herein with reference to FIGS. 2-10.

In the illustrated embodiments, the semiconductor fins 120 are arranged in parallel and are laterally isolated from each other within a sub-fin region 122 by a shallow trench isolation layer 200. The fins 120 extend above a top surface of the shallow trench isolation layer (STI) layer 200 and define an active device region 124. According to various embodiments, a first group of fins 120, such as fins within a first device region of the substrate 100, may be configured to form an n-type FET (NFET), while a second group of fins 120 located within a second device region of the substrate 100 may be configured to form a p-type FET (PFET).

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including Ill-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer.

Substrate 100 may have dimensions as typically used in the art and may be, for example, a semiconductor wafer.

Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may include (100)-oriented silicon or (111)-oriented silicon, for example.

In various embodiments, fins 120 include a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In certain embodiments, the fins 120 can have a width of 5 nm to 20 nm and a height of 40 nm to 150 nm, although other dimensions are contemplated. Fins 120 may be arrayed on the substrate 100 at a regular intrafin spacing or pitch (d). As used herein, the term "pitch" refers to the sum of the fin width and the spacing between a pair of adjacent fins. In example embodiments, the fin pitch (d) within a given device region may be within a range of 20 to 100 nm, e.g., 20, 30, 40, 50, 60, 70, 80, 90 or 100 nm, including ranges between any of the foregoing values, although smaller and larger pitch values may be used.

Referring still to FIGS. 1A and 1B, shallow trench isolation (STI) layer 200 may be used to provide electrical isolation between the fins 120 and between adjacent devices as is needed for the circuit(s) being formed. An STI process for FinFET devices involves creating isolation trenches in the semiconductor substrate 100 through an anisotropic etch process. The isolation trench between each adjacent fin may have a relatively low aspect ratio (e.g., ratio of the depth of the isolation trench to its width). A dielectric filler material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is then etched back to form a recessed, uniformly thick oxide isolation layer 200 between the fins 120, where upper sidewalls of the fins 120, i.e., sidewalls within active device region 124, can be exposed for further processing.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Portions of the fins 120 may be coated with a thin conformal oxide layer, which is referred to herein as an extended gate or EG oxide layer 310. The EG oxide layer 310 may include silicon dioxide, for example, and may be formed over the fins within the active device region 124. The EG oxide layer 310 may have a thickness of 2 to 3 nm. During the course of manufacturing the FinFET device, the EG oxide 310 may be stripped from source and drain regions of the fins and/or channel regions of the fins.

Illustrated in FIGS. 1A and 1B is a replacement metal gate (RMG) structure following formation of a sacrificial gate 430 over respective channel regions of the fins 120. The sacrificial gate 430 may be formed using conventional deposition, photolithography and etching processes. The sacrificial gate 430 may include a layer of amorphous silicon (a-Si) or polycrystalline silicon, for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition.

The sacrificial gate 430 may have a thickness sufficient to completely cover the fins 120. For instance, a thickness of sacrificial gate 430 may range from 50 to 200 nm, e.g., 50, 75, 100, 125, 150, 175 or 200 nm, including ranges between any of the foregoing values, although lesser and greater thicknesses may be used.

Figure 2:
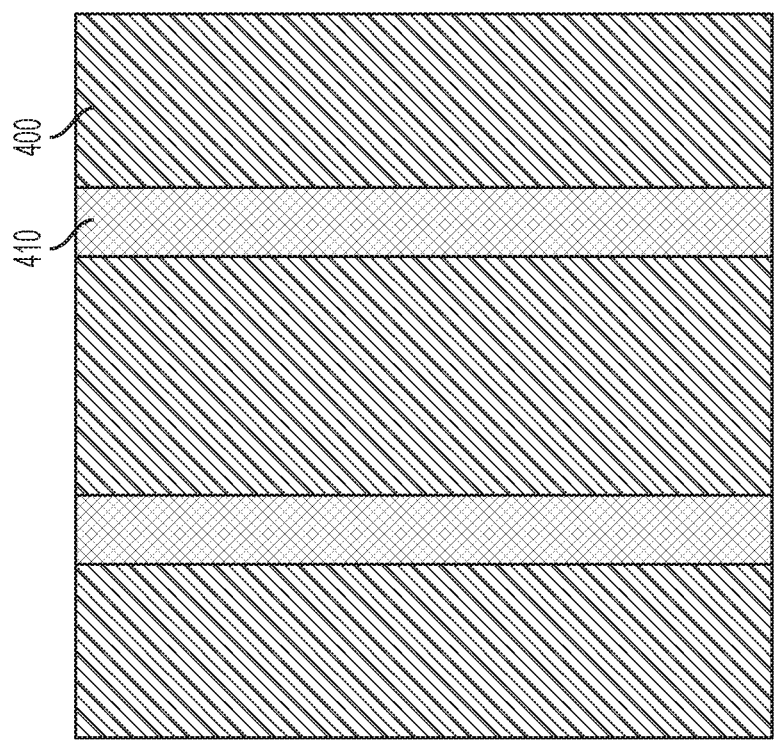
FIG. 2 is a top-down plan view schematic depicting the formation of a sacrificial gate layer over a plurality of semiconductor fins, and a patterned hard mask over the sacrificial gate layer.

Referring to FIG. 2, a sacrificial gate 430 may be formed from a blanket sacrificial gate layer 400 that is deposited over the fins. A hard mask 410 is formed over the sacrificial gate layer 400 and patterned, for example, using conventional photolithography and etching techniques. The hard mask 410 may include a dielectric material such as silicon nitride, and may be formed using chemical vapor deposition.

Referring to FIG. 3, in addition to patterning the hard mask 410 to define the sacrificial gates, the hard mask 410 is patterned to define narrow gate cut region 440. The narrow gate cut region 440 is located between a pair of adjacent fins, and identifies the portion of the sacrificial gate that will be cut.

Figure 4A:
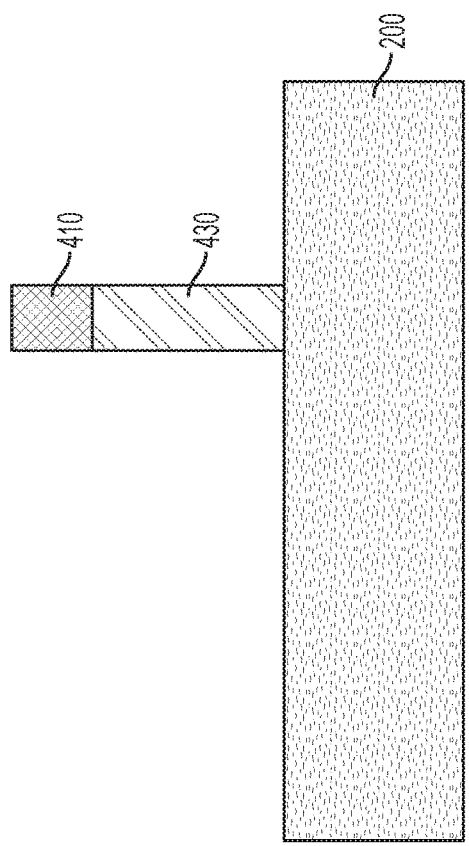
FIG. 4A is a cross-sectional view along line A of FIG. 4 showing a sacrificial gate and a narrow gate cut opening overlying a shallow trench isolation (STI) layer between adjacent fins.
Figure 4B:
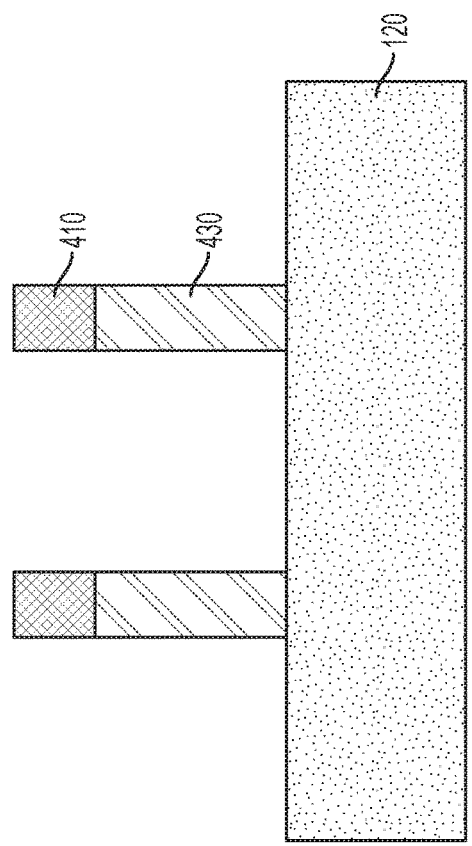
FIG. 4B is a cross-sectional view along line B of FIG. 4 showing a pair of sacrificial gates overlying a semiconductor fin.
Figure 4:
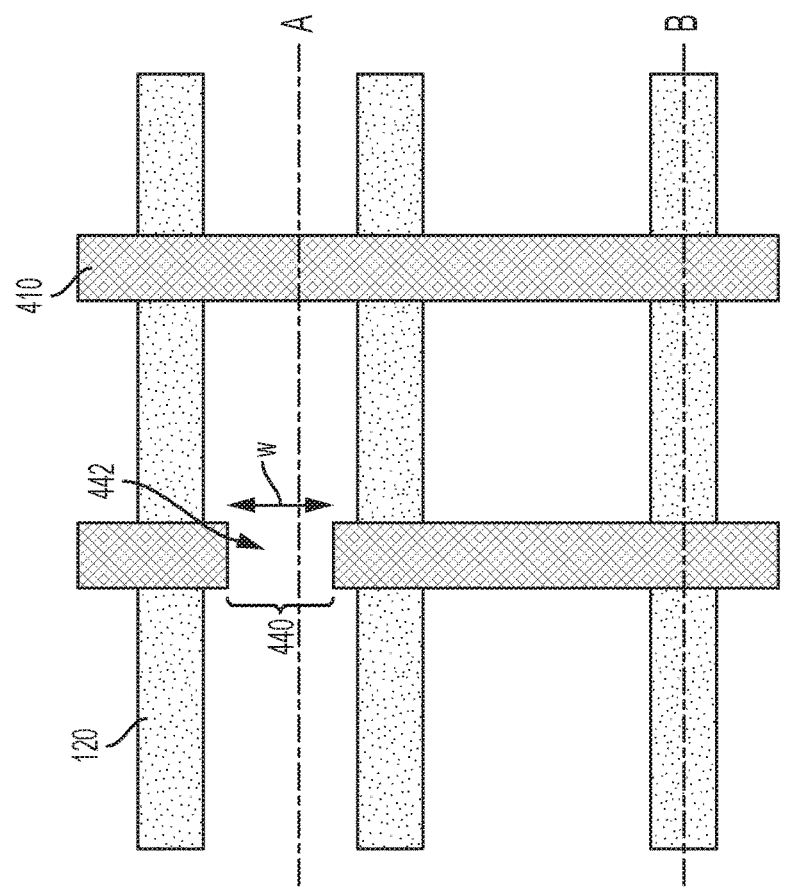
FIG. 4 is a top-down plan view depicting etching of the sacrificial gate layer using the hard mask as an etch mask to form sacrificial gates and a narrow gate cut opening.

Thereafter, referring to FIG. 4, using the hard mask 410 as an etch mask, the sacrificial gate layer 400 is etched to form the sacrificial gates 430, including a narrow gate cut opening 442 that segments a sacrificial gate. That is, the narrow gate cut opening 442 is formed during the etching step that forms the sacrificial gates. As seen in FIG. 4A, the narrow gate cut opening is located between adjacent fins, i.e., over shallow trench isolation layer 200.

The pattern transfer etching process to form sacrificial gates 430 and the narrow gate cut opening 442 typically includes an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Sacrificial gates 430 are adapted to provide a temporary structure for a replacement metal gate (RMG) module that is used to form a functional gate over respective channels regions of a fin 120.

Narrow gate cut opening 442 may have areal dimensions (length and width) that independently range from 10 to 25 nm, e.g., 10, 15, 20 or 25 nm, including ranges between any of the foregoing values, although lesser and greater dimensions may be used. Along a dimension orthogonal to a length direction of the fins, a lateral dimension (critical dimension) (w) of the narrow gate cut opening 442 is defined by the severed sacrificial gate 430 and overlying hard mask 410.

According to certain embodiments, by forming the narrow gate cut opening 442 before or during the act of etching the sacrificial gate layer 400 to form the sacrificial gates 430, the amount of sacrificial gate residue remaining within the narrow gate cut opening 442 may be less than the amount of residue associated with etching the already-formed sacrificial gates 430 in a later etch step to form the narrow gate cut opening 442. Etch residue within the narrow gate cut region 440 may contribute to gate-to-gate (i.e., "tip-to-tip") short circuits between later-formed functional gates and adversely affect performance and yield. As will be appreciated, the retention of etch residue may be exacerbated by the relatively narrow critical dimension (CD) of the narrow gate cut opening 442.

Referring to FIG. 5, FIG. 5A and FIG. 5B, a first spacer layer 450 is formed over sidewalls of the sacrificial gates 430, including within the narrow gate cut opening 442 over endwalls of the cut sacrificial gate. First spacer layer 450 partially fills the narrow gate cut opening 442 along a dimension orthogonal to a length of the fins 120. That is, narrow gate cut region 440 includes a first spacer layer 450 disposed over one pair of opposing sidewalls of the narrow gate cut opening 442. As illustrated in FIG. 5, the first spacer layer 450 is formed over endwalls of the cut sacrificial gate 430 and extends parallel to a length direction of the fins 120.

First spacer layer 450 may be formed by blanket deposition of a spacer material (e.g., using atomic layer deposition) followed by a directional etch such as reactive ion etching (RIE) to remove the spacer material from horizontal surfaces. Suitable materials for first spacer layer 450 include oxides, nitrides and oxynitrides, such as silicon dioxide, silicon nitride, silicon oxynitride, and low dielectric constant (low-k) materials such as amorphous carbon, SiOC, SiCN, SiOCN and SiBCN, as well as a low-k dielectric material. In certain embodiments, the thickness of the first spacer layer 450 may be 2 to 5 nm, e.g., 2, 3, 4, or 5 nm, including ranges between any of the foregoing values.

As will be appreciated, the compounds silicon dioxide and silicon nitride have compositions that are nominally represented as $SiO_2$ and $Si_3N_4$, respectively. The terms silicon dioxide and silicon nitride, refer to not only these stoichiometric compositions, but also to oxide and nitride compositions that deviate from the stoichiometric compositions.

As used herein, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

Figure 6A:
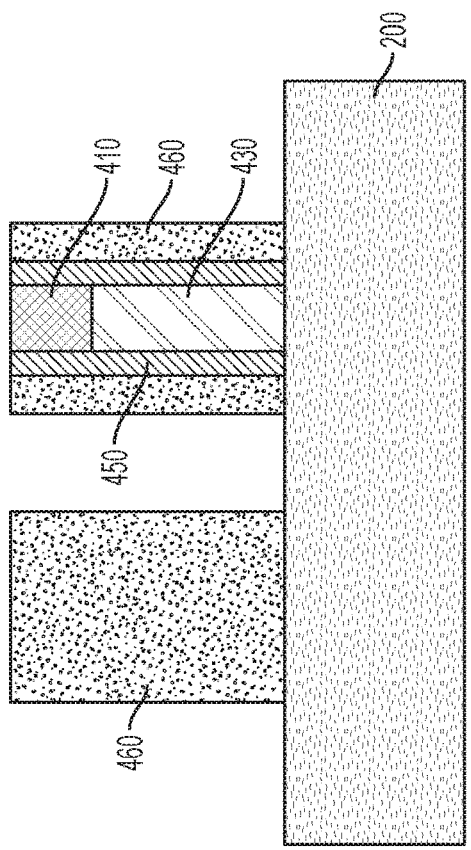
FIG. 6A shows the second spacer layer filling a portion of the narrow gate cut opening.
Figure 6B:
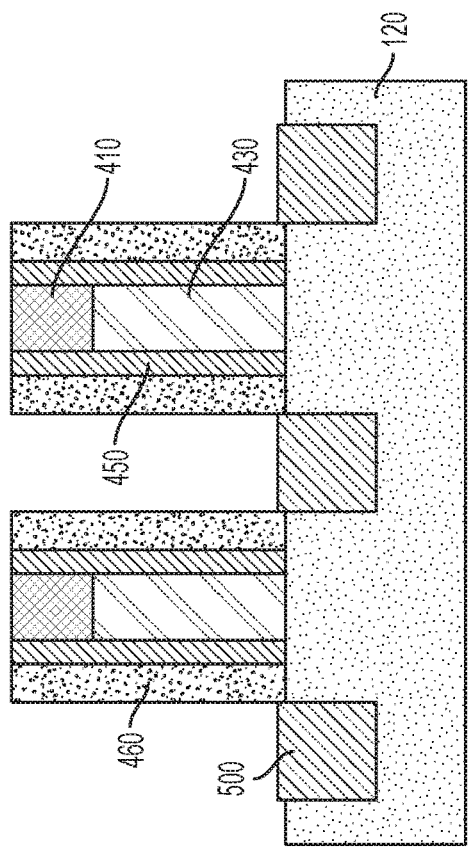
FIG. 6B shows the formation of source/drain junctions over source/drain regions of the fin.
Figure 6:
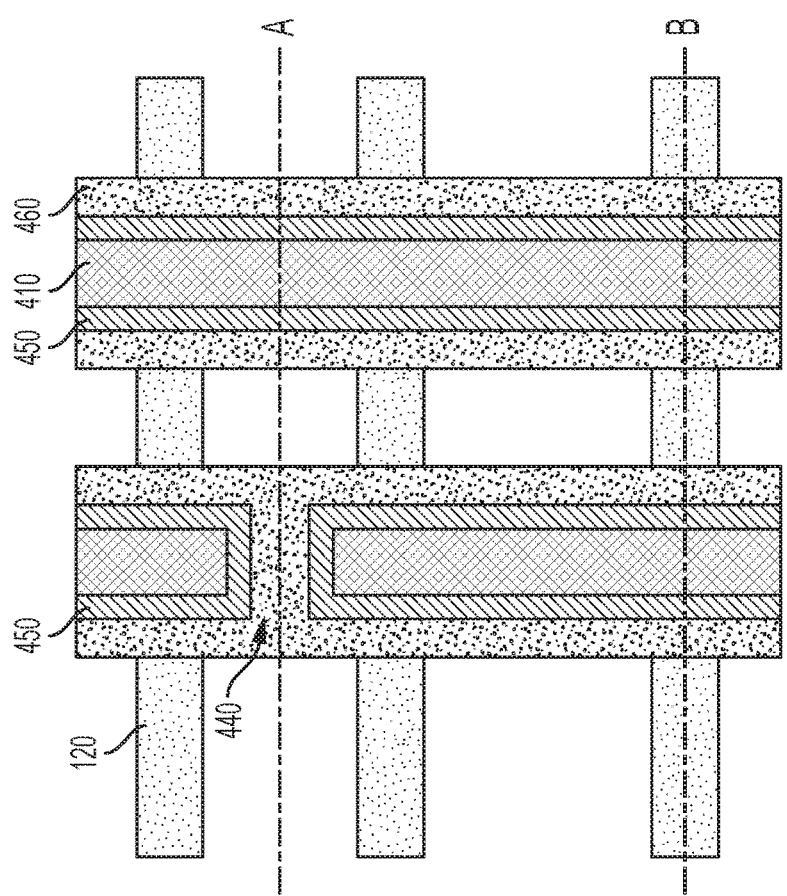
FIG. 6 shows the formation of a second spacer layer over sidewalls of the first spacer layer and filling the narrow gate cut opening.

Referring to FIG. 6, FIG. 6A and FIG. 6B, a second spacer layer 460 is formed over the first spacer layer 450. In particular, and as shown in FIGS. 6 and 6A, the second spacer layer 460 fills the narrow gate cut opening 440 between the opposing endwalls of the cut sacrificial gate 430. According to various embodiments, the methods and materials used to form first spacer layer 450 may be used to form second spacer layer 460. In certain embodiments, the thickness of the second spacer layer 460 may be 5 to 10 nm, e.g., 5, 8 or 10 nm, including ranges between any of the foregoing values. According to certain embodiments, the first and second spacer layer materials are etch selective with respect to silicon dioxide and amorphous silicon. In an example structure, the first spacer layer 450 includes silicon nitride and the second spacer layer 460 includes a low-k material.

Thus, the narrow gate cut region 440 includes a first spacer layer 450 formed over sidewalls of the sacrificial gate, and a second spacer layer 460 formed over sidewalls and between opposing first spacer layers 450. In certain embodiments, the first and second spacer layers 450, 460 partially fill the narrow gate cut opening 442. In certain embodiments, as shown in FIGS. 6 and 6A, the first and second spacer layers 450, 460 entirely fill the narrow gate cut opening 442.

Referring to FIG. 6B, source/drain junctions 500 are formed over source/drain regions of fin 120. Source/drain junctions 500 may be formed by ion implantation or selective epitaxy following formation of the sacrificial gate 430 and spacer layers 450, 460, e.g., using spacers layer 460 as an alignment mask.

According to various embodiments, source/drain junctions 500 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the formation of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. Example epitaxial growth processes include low energy plasma deposition, liquid phase epitaxy, molecular beam epitaxy, and atmospheric pressure chemical vapor deposition.

The source/drain junctions 500 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 500 may be diffused into the semiconductor fin 120 using a post-epitaxy or post-implantation anneal (e.g., at a temperature of 600° C. to 1400° C.) to create a desired dopant profile within the fin.

Referring to FIG. 7, FIG. 7A and FIG. 7B, an interlayer dielectric (ILD) 600 is deposited over the fins and over source/drain junctions 500, as well as over the STI layer 200 between fins 120. A CMP step may be used to remove the overburden and form a planarized structure, e.g., using hard mask 410 as an etch stop layer. As will be appreciated, in various embodiments, deposition of the ILD layer 600 is performed after deposition of the first and second spacer layers 450, 460, i.e., after back-filling the narrow gate cut openings 442.

Figure 8A:
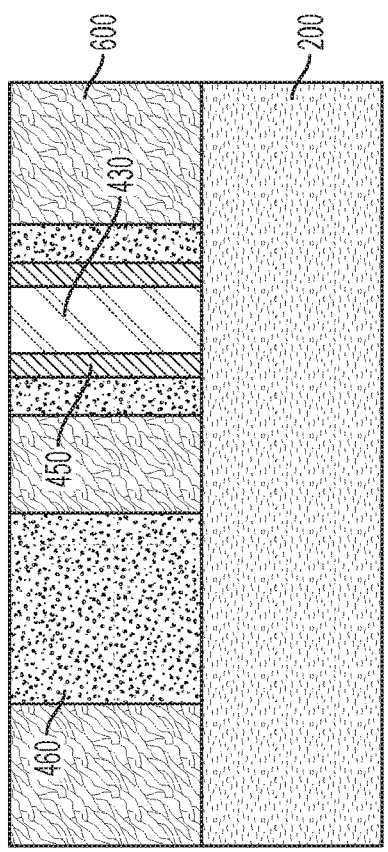
FIG. 8A shows removal of the hard mask from over the sacrificial gates.
Figure 8B:
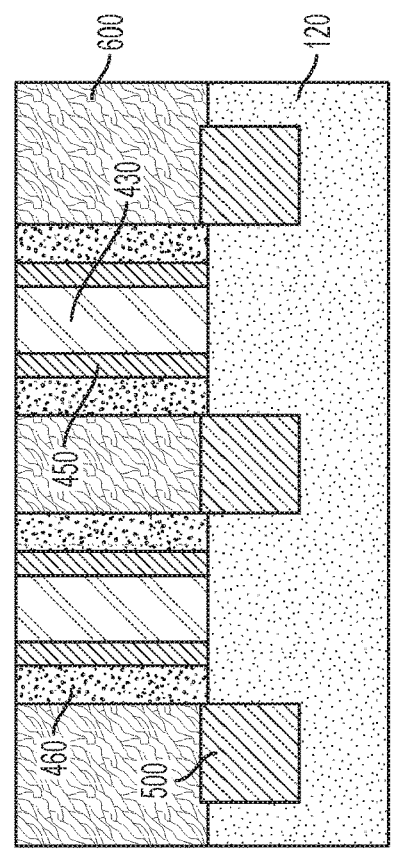
FIG. 8B shows removal of the hard mask from over the sacrificial gates and the resulting planarized structure.
Figure 8:
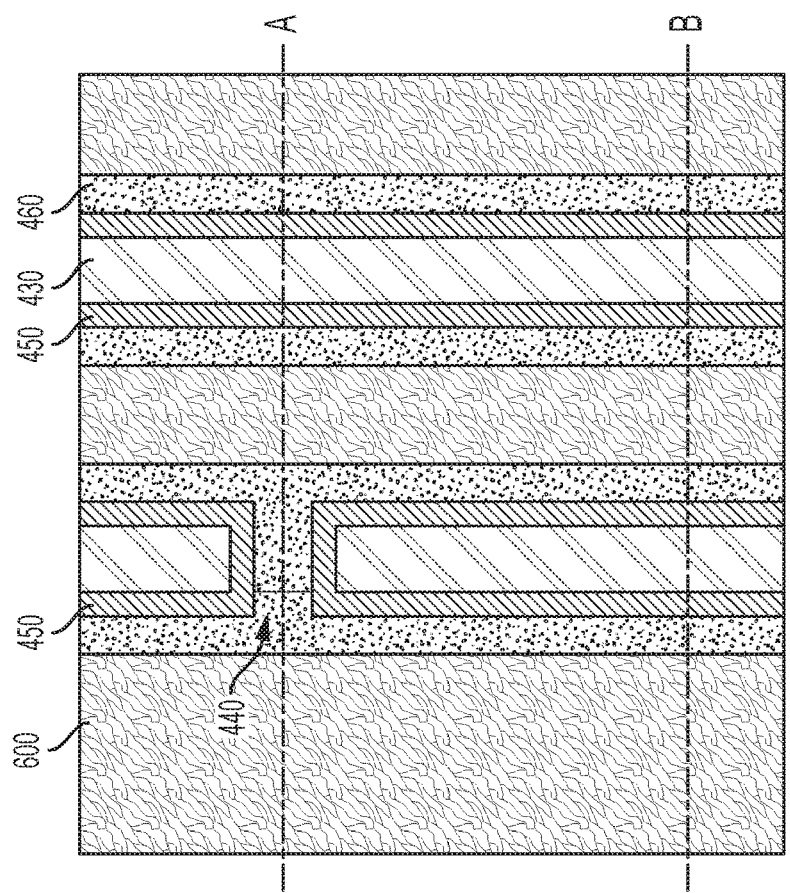
FIG. 8 shows removal of the hard mask to expose the sacrificial gates.

The ILD layer 600 may include silicon dioxide, for example, and may be formed by chemical vapor deposition (CVD). As shown in FIG. 8, FIG. 8A and FIG. 8B, a further polishing step may be used to remove the hard mask 410 from over the sacrificial gates 430 to expose a top surface of the sacrificial gates 430, e.g., using the sacrificial gates as an etch stop layer.

Figure 9A:
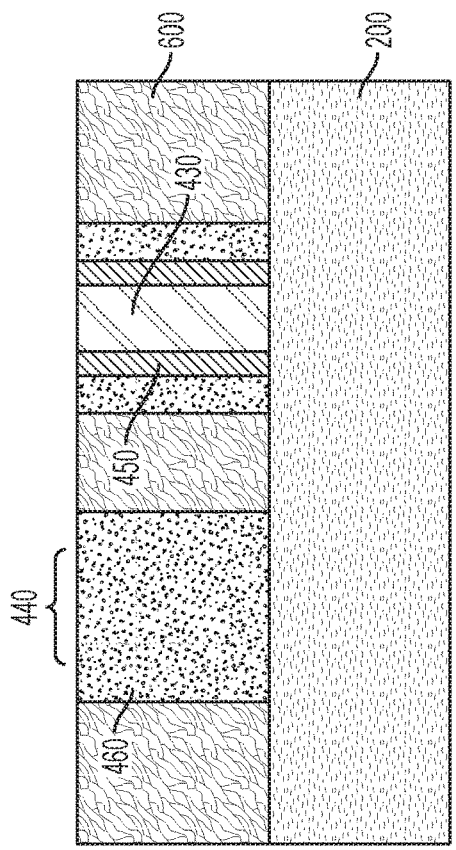
FIG. 9A shows the structure of the narrow gate cut region after formation of the wide gate cut opening.
Figure 9B:
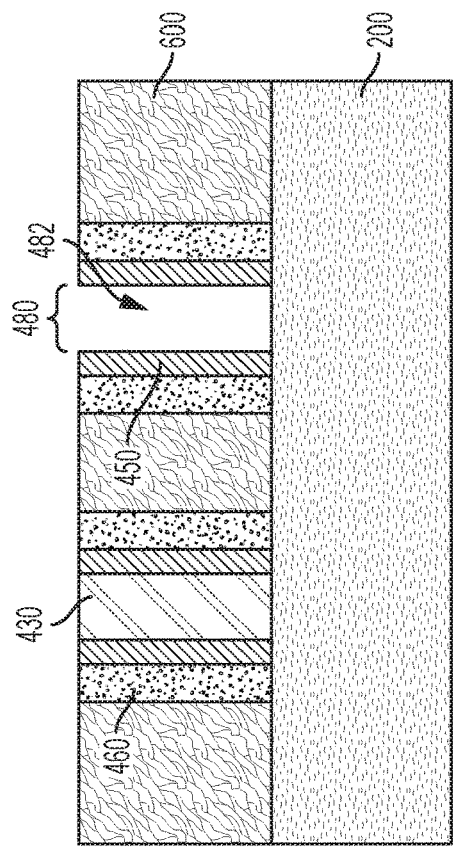
FIG. 9B shows etching of the sacrificial gate to form the wide gate cut opening over STI.
Figure 9:
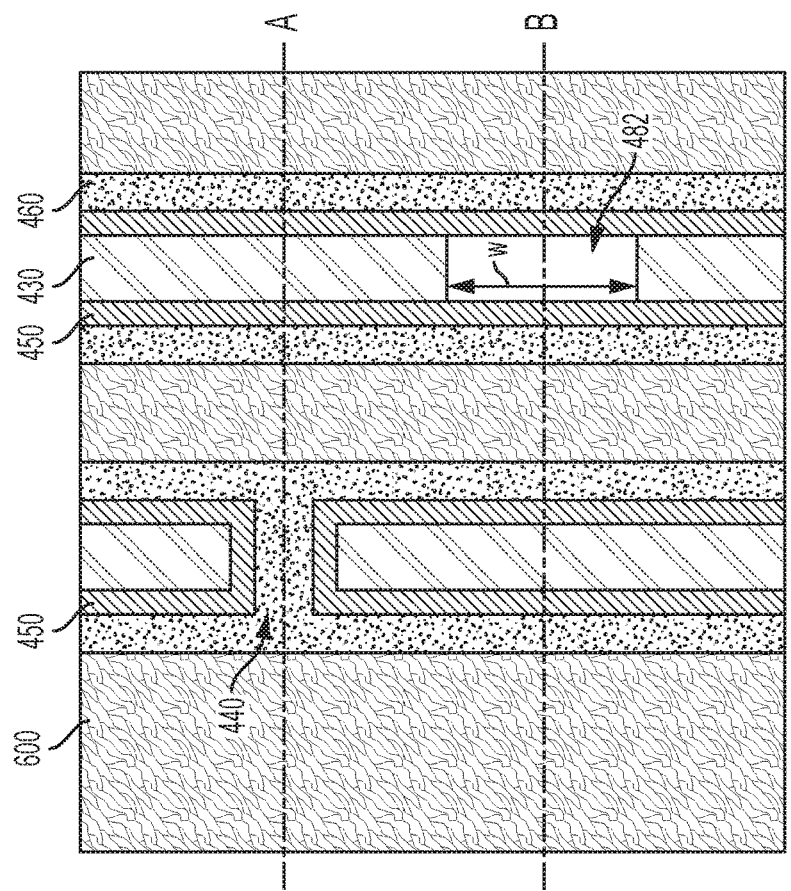
FIG. 9 depicts the formation of a wide gate cut opening over the shallow trench isolation layer and between remotely-spaced fins.

Referring to FIG. 9, FIG. 9A and FIG. 9B, a wide gate cut opening 482 may be formed by directionally etching the sacrificial gate 430. As shown in the illustrated embodiment, wide gate cut opening 482 extends entirely through the sacrificial gate 430 and exposes STI layer 200. The wide gate cut opening 482 is configured to expose a portion of the STI layer 200 between adjacent fins without exposing the fins themselves.

Wide gate cut opening 482 may be formed using patterning and etching processes known to those skilled in the art. The patterning process may comprise photolithography, for example, which includes forming a layer of photoresist material (not shown) atop one or more layers to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the sacrificial gate 430 utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

As will be appreciated, in addition to a layer of photoresist, patterning and etching of the sacrificial gate 430 to form wide gate cut openings 482 may including forming a lithography stack over the sacrificial gate 430. A lithography stack may include one or more of an optical planarization layer, an etch stop layer, an amorphous carbon layer, an adhesion layer, an oxide layer, and a nitride layer (not shown). Such layers may be configured as known to those skilled in the art to provide a suitable masking layer to pattern and etch the sacrificial gate 430.

A wide gate cut opening 482 may have areal dimensions (length and width) that independently range from 30 to 100 nm, although lesser and greater dimensions may be used. According to various embodiments, the areal dimensions of the wide gate cut openings 482 are within lithography process windows for forming such structures, and enable the wide gate cut openings 482 to be defined with substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values. In certain embodiments, the width (w) of the wide gate cut opening 482 ranges from 30 to 100 nm, e.g., 30, 35, 40, 50 or 100 nm, including ranges between any of the foregoing values. According to various embodiments, wide gate cut openings 482 may be defined with substantially vertical sidewalls.

Figure 10A:
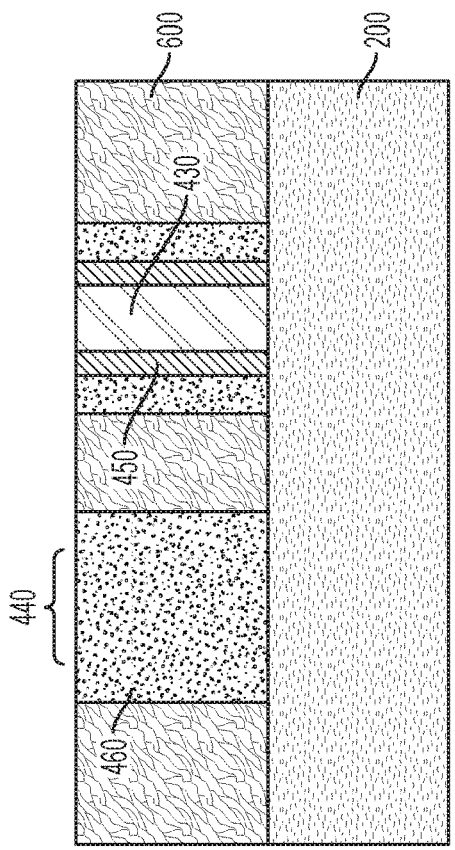
FIG. 10A is a post-planarization view showing the narrow gate cut region following deposition of the dielectric layer to fill the wide gate cut opening.
Figure 10B:
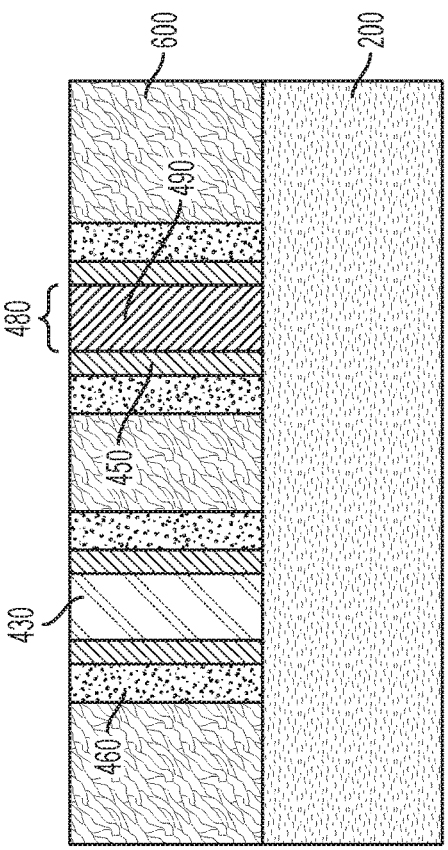
FIG. 10B is a post-planarization view showing the wide gate cut region following deposition of the dielectric fill layer within the wide gate cut opening.
Figure 10:
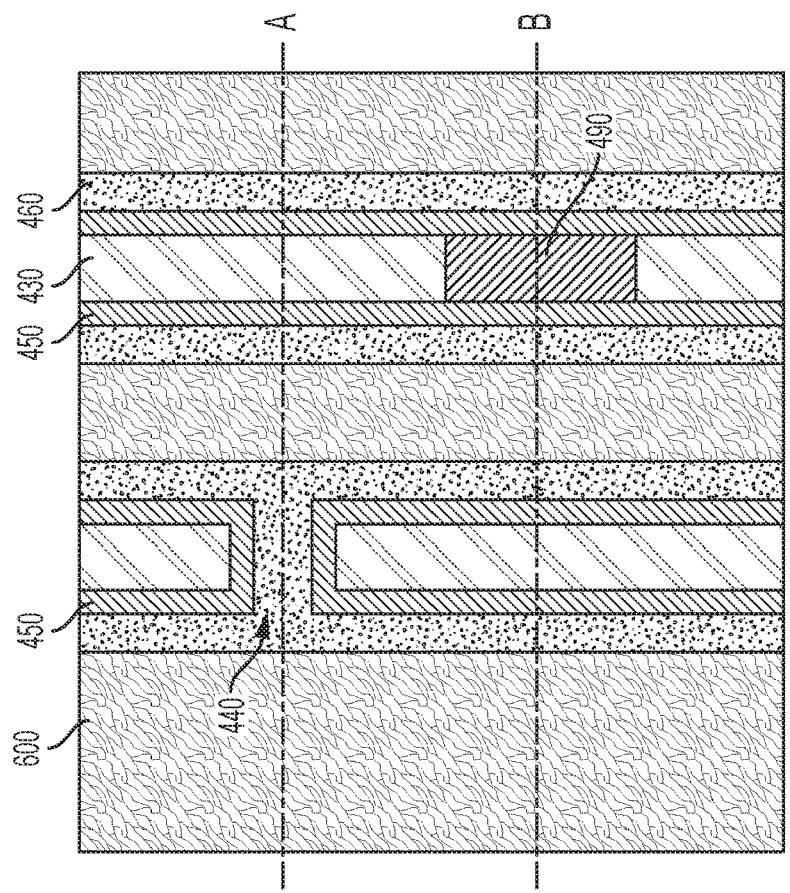
FIG. 10 depicts deposition of a dielectric fill layer within the wide gate cut opening.

Referring to FIG. 10, FIG. 10A and FIG. 10B, a dielectric fill layer 490 is deposited within wide gate cut openings 482. In various embodiments, the fill layer 490 completely fills the wide gate cut openings 482. For instance, the fill layer 490 may be formed by atomic layer deposition (ALD) and may comprise dielectric material such as silicon nitride. In an exemplary ALD process, a silicon-containing precursor and a nitrogen-containing precursor are deposited in succession and reacted to form the nitride fill layer.

Chemical mechanical polishing step may be used to selectively remove the overburden following deposition of the fill layer 490 and produce a planarized structure. The sacrificial gates 430 may serve as a CMP etch stop during removal of the excess fill layer material, such that the CMP step removes the lithography stack as well.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Additional processing may be used to form a functional device, including a replacement metal gate (RMG) module to remove and replace the sacrificial gates with functional gates, and middle-of-the line and back-of-the line metallization and interconnect modules to form suitable electrical connections.

As described herein, the formation or deposition of a layer or structure, including the foregoing layers and structures, may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

As used herein, the singular forms "a," "an" and "the" include plural referents unless the context clearly dictates otherwise. Thus, for example, reference to a "semiconductor fin" includes examples having two or more such "semiconductor fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a sacrificial gate that comprises amorphous silicon include embodiments where a sacrificial gate layer consists essentially of amorphous silicon and embodiments where a sacrificial gate consists of amorphous silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
    forming a plurality of semiconductor fins over a semiconductor substrate;
    forming a sacrificial gate layer over the fins;
    etching the sacrificial gate layer to form a sacrificial gate and a narrow gate cut opening extending through a portion of the sacrificial gate between adjacent fins;
    forming a first spacer layer over sidewalls of the sacrificial gate;
    forming a second spacer layer over sidewalls of the first spacer layer;
    etching the sacrificial gate to form a wide gate opening extending through the sacrificial gate between adjacent fins; and
    forming a dielectric fill layer within the wide gate cut opening.

2. The method of claim 1, wherein the sacrificial gate and the narrow gate cut opening are formed simultaneously.

3. The method of claim 1, wherein the first spacer layer partially fills the narrow gate cut opening.

4. The method of claim 1, wherein the first spacer layer and the second spacer layer entirely fill the narrow gate cut opening.

5. The method of claim 1, wherein the first spacer layer comprises silicon nitride and the second spacer layer comprises a low-k dielectric.

6. The method of claim 1, wherein the dielectric fill layer comprises silicon nitride.

7. The method of claim 1, wherein the first spacer layer defines a pair of opposing sidewalls of the wide gate cut opening.

8. The method of claim 1, wherein the narrow gate cut opening has a width measured orthogonal to a length dimension of the fins of 10 to 25 nm.

9. The method of claim 1, wherein the wide gate cut opening has a width measured orthogonal to a length dimension of the fins of 30 to 100 nm.

10. The method of claim 1, further comprising forming an interlayer dielectric over the substrate and between adjacent sacrificial gates after forming the first and second spacer layers.

* * * * *